United States Patent [19]

Okai

[11] 3,877,939

[45] Apr. 15, 1975

[54] PHOTOPOLYMER PRINTING PLATES AND COATED RELIEF PRINTING PLATES

[75] Inventor: Sakuo Okai, Kyoto, Japan

[73] Assignee: Nippon Paint Co., Ltd., Osaka, Japan

[22] Filed: June 25, 1973

[21] Appl. No.: 373,174

[52] U.S. Cl. .................... 96/36.3; 96/35.1; 96/86 P

[51] Int. Cl. ............................ G03c 5/00; G03f 7/00

[58] Field of Search .............. 96/36.3, 36, 33, 86 P, 96/35.1, 115 P

[56] References Cited

UNITED STATES PATENTS

| | | | |
|---|---|---|---|
| 3,380,825 | 4/1968 | Webers | 96/35.1 |
| 3,630,746 | 12/1971 | Takimoto et al. | 96/115 P |
| 3,640,712 | 2/1972 | Field et al. | 96/36 |
| 3,652,274 | 3/1972 | Verelst et al. | 96/36.3 |
| 3,723,120 | 3/1973 | Hummel | 96/35.1 |
| 3,801,328 | 4/1974 | Takimoto | 96/36.3 |

*Primary Examiner*—J. Travis Brown

[57] ABSTRACT

A photopolymer printing plate developable with water which includes a support material, the adhering surface of which is both abraded and treated with an aqueous solution of a chromic compound, such as chromic acid, a thin primer layer to improve adhesion, and a layer of a water-soluble photosensitive resin composition comprising at least one unsaturated ethyleric compound, preferably having a boiling point about 100°C., a molecular weight below 1500 and 1 to 4 polymerizable ethylenic groups, said ethylenic compound being polymerizable by means of actinic light in the presence of a photopolymerization initiator, a photopolymerization initiator and a partially saponified polyvinyl acetate. The plates can be used as printing plates or can be used to prepare relief images. In this latter form, e.g., relief printing plates, the plates are preferably treated with a water-repellant solution containing a dimethylpolysiloxane to make the plates water resistant and to reduce linting problems during subsequent use.

12 Claims, No Drawings

PHOTOPOLYMER PRINTING PLATES AND COATED RELIEF PRINTING PLATES

The present invention relates to photopolymerizable printing plates developable with water, said plates being directly utilizable as printing plates per se and also being useful for the production of relief images. This invention further relates to relief printing plates which have been coated with water-repellant coatings to improve their hardness characteristics and reduce linting tendencies during use.

Insofar as photopolymer printing plates are concerned, it is especially desirable to use photopolymerizable compositions capable of producing final printing plates that are easily developed yet sufficiently hard to enable repeated use. Heretofore, organic solvents or aqueous alkaline solutions have been generally used in the preparation, e.g., developing, of the known photopolymer plates. The developing process for such plates is complex because the preparation of the developing chemicals is complicated and gives rise to a host of problems that cannot be easily avoided. If the solvent preparation is not done properly, for example, printing plates having desired properties cannot be obtained. In contrast, a photopolymer composition developable with plain water is capable of avoiding troublesome preparations and also removes the danger of mistaken preparations. With the use of water, potential poisoning to workers and drainage problems inherent with the use of harsh developing liquids can be avoided. Moreover, the cost of developing is reduced since the need for expensive solvent developers is eliminated.

Even though water-developable photopolymer printing plates have been used quite successfully in place of the less desirable solvent-developable plates, however, a number of practical difficulties have arisen with such water-developable plates. It has been observed, for example, that water-developable plates have a tendency to soften during prolonged exposure to the atmosphere, primarily as a result of the adverse effects of moisture present in the air. It has also been observed that fully developed plates, in the form of relief printing plates, tend to pick-up ink and paper fibers during prolonged use and result in what is commonly referred to as linting. In particular, linting is caused by the accumulation of ink, paper fibers and other foreign materials in the recessed areas of the relief printing plate. When linted plates are used in printing half-tones, highly undesirable dark spots are observed in the finished printed material.

Besides the linting and moisture softening problems, however, it has also been observed that water-developable printing plates sometimes exhibit rather poor adhesiveness between the support or base material and the photopolymerizable layer. In fact, it has been observed for some such plates that the layer of photopolymerizable composition can be peeled away from the support material, even where separate adhesive or anchor layers are used between the support material and the photopolymerizable composition.

Finally, as in almost all photopolymer plates, water-developable plates often use antihalation materials, either as separate layers or dispersed in the photopolymer layer, to reduce the tendency of light, which passes through the photopolymerizable composition, from reflecting in different directions from the support material. The use of either separate antihalation layers or dispersed antihalation materials, however, has n proved to be completely satisfactory, and thus altern tive techniques for providing the desired antihalatic characteristics have been actively sought by thos skilled in the art.

The present invention overcomes each of the afor mentioned problems and yet, at the same time, pr serves all of the numerous advantages of wate developable printing plates, e.g., hardness, durabilit water-washability and low cost. Accordingly, it is or of the objects of this invention to provide a wate washable photopolymer printing plate and relief prin ing plates that are free of the aforementioned difficu ties of currently available plates.

Another object of this invention is to provide reli printing plates that are water-washable and yet are n readily softened upon exposure to moisute in the a and are relatively free from serious linting problems.

Still another object of this invention is to provide photopolymer printing plate that has vastly improve bonding characteristics between the support materi and the photopolymerizable composition layer.

Finally, it is still another object of this invention t provide a photopolymer printing plate capable of pr viding desired antihalation characteristics without th use of either separate antihalation layers or antihal tion materials dispersed in the photopolymerizab composition.

These and other objects and advantages of the pre ent invention will become apparent from a conside ation of the following specification and claims.

The photopolymerizable composition of the prese invention generally comprises the following three con ponents: (a) at least one unsaturated ethylenic mon mer, preferably having a boiling point about 100°C., molecular weight below 1500 and 1 to 4 polymerizab ethylenic groups, and being polymerizable by actin light in the presence of a photopolymerization initiato (b) a photopolymerization initiator; and (c) a partial saponified polyvinyl acetate, namely a polymer havin both acetyl groups and hydroxy groups produced by s ponification of polyvinyl acetate and the like and bein water-soluble and compatible with the monomer con ponent of (a).

It has been observed and this invention recogniz that the following ratios by weight of the above comp nents results in the formation of a photopolymerizab composition having the desired balance of propertie component (a), about 0.1 to 3.0 parts; component (b about 0.001 to 0.15 parts; and component (c), abo 0.1 to 1.0 parts. Naturally, it should be understood th these suggested ratios, although experimentally dete mined to be desirable and preferred, can nonethele be altered, if desired, depending on the particular u that is contemplated for the printing plates. In additio about 0.01 to 0.3 percent based upon the amount component (a), of a thermal polymerization inhibit can also be incorporated in the composition as a four component.

The ethylenic unsaturated monomer, e.g., comp nent (a), used in the practice of this invention general comprises: (1) an acrylic or methacrylic ester of lower alkanol having one or more hydroxy groups, (2) an acrylic or methacrylic ester of polyethylene gl col [$HO(CH_2CH_2O)_nH$] which is etherified or ester fied at one end thereof or (3) mixtures of both (1) an (2). Examples of unsaturated ethylenic compound a (1) β-hydroxyethel acrylate, β-hydroxyethyl methacrylate, β-hydroxypropyl acrylate, and β-hydroxypropyl methacrylate, wherein *n* is 1, the compound being esterified at one end of the diol, and (2) methoxypolyethylene glycol monoacrylate, methoxypolyethylene glycol monomethacrylate, and polyethylene glycoldiester (e.g., polyethylene glycol diacrylate or polyethylene glycol dimethacrylate) being an acrylic or methacrylic half ester of polyethylene glycol and being etherified or esterified at the hydroxy group on the opposite side from the ester moiety of the molecule. In the said polyethylene glycol derivatives (2), *n* is preferably 1 and 9 to 23, i.e., the number of ethylene oxide units is ether 1 or 9 to 23. Within this range of *n*, the ethylenic compound is compatible with the other components in the preparation of the photopolymerizable composition, and the resulting composition shows an excellent water-solubility in the preparation of a printing plate. Further, other effective compounds such as glycerol dimethacrylate, pentaerythritol dimethacrylate, trimethylolpropane trimethacrylate, trimethylol ethane trimethacrylate, and tetramethylolmethane tetramethacrylate may be used solely or in combination.

It should be recognized that the ethylenic unsaturated monomer component (a) can include mixtures of both mono- and di-functional compounds, the monofunctional compounds serving as solubilizing materials for the initiator component, and the di- or polyfunctional compounds enhancing the adhesive characteristics of the resultant photopolymerizable composition. Thus, by using both the water-soluble monofunctional ethylenic unsaturated compound and a water-insoluble polyfunctional ethylenic unsaturated compound, the highly desirable balance of properties, e.g., water-washability and high adhesion, can be imparted to the photopolymerizable composition.

As the initiator, component (b), benzoin alkylate compounds, preferably having 1 to 8 carbon atoms, are used. Benzoin alkylate compounds are preferred because they are capable of forming a transparent photopolymerizable layer. In addition, they are soluble in the ethylenic unsaturated component (a) and are excellently compatible with the other components in the aqueous composition. Moreover, since benzoin alkylate compounds are not decomposed thermally below about 100°C., they do not harden or become insoluble with heating during the preparation of the photopolymerizable composition. Specific examples of the benzoin alkylate compounds found useful in the practice of this invention are methyl, ethyl, isopropyl, octyl, vinyl and allyl ethers of benzoin, i.e., benzoin methyl ether, benzoin ethyl ether, benzoin vinyl ether, benzoin allyl ether, etc. The presently preferred initiator is benzoin isopropyl ether because of its unexpectedly high solubility in the monomer components of this invention.

Although ordinary photopolymerization requires a photoinitiator such as anthraquinone compounds in addition to the polymerization initiators discussed above, a high photosensibility can be attained in the present invention without a photoinitiator such as anthraquinone but instead by using a benzoin alkylate initiator alone.

The polymer component (c), used in the practice of this invention is partially saponified polyvinyl acetate, preferably having an average degree of polymerization of 300 to 2000 and a saponification degree of 65 to 99 mole percent. If a suitable partially saponified polyvinyl acetate cannot be obtained by saponifying polyvinyl acetate having a low saponification degree as a homopolymer, a copolymer obtained, for example, by copolymerizing vinyl acetate with maleic anhydride can be partially saponified to give the desired polymer. Saponification as used herein is intended to mean the conversion of ester groups or the like into alcohol groups and the saponification degree represents the extent to which ester groups or the like have been converted to alcohol or hydroxy groups. Degree of polymerization, as used herein, is intended to represent the molecular weight and viscosity of the polymer, as indicated in Davidson and Sittig, *Water-Soluble Resins* (1962) at p. 89, the disclosure of which is incorporated herein by reference.

The hardness of the obtained printing plate, as well as the speed of washing out in the developing procedure, depends directly on the degree of saponification. Thus, to accomplish the desirable balance of properties referred to above, it is preferred that the partially saponified polyvinyl acetate have a degree of saponification within the stated range. There are some cases, for example, wherein a certain degree of saponification is required for compatibility with certain monomer components. Thus, it has been recognized that the required degree of saponification may be obtained by mixing two or more partially saponified polyvinyl acetate polymers having different degrees of saponification and then calculating the arithmetic average of the different degrees of saponification. Mixtures of two or more polymers can be used, therefore, each having a different saponification degree, to obtain the desired average saponification degree for any given monomer component. This feature of the present invention adds significant flexibility to the formulation process and contributes significantly to the balance properties that are desired for the photopolymerizable composition.

Among the thermal polymerization inhibitors useful in the practice of this invention are 2,6 di-t-butyl-p-cresol, hydroquinone and p-methoxyphenol. The preferred inhibitor is di-t-butyl-p-cresol because of its compatibility with the other components.

As noted above, even photopolymer plates using the above-described photopolymerizable composition have not been entirely free of the poor adhesion, antihalation, linting and polymer softening problems of typical water-washable plates. It has, therefore, been recognized through the practice of this invention that the use of a separate antihalation layer or dispersed antihalation material can be eliminated by treating the support material with an aqueous solution of a chromic compound. Generally, the support material used in the practice of this invention is a metallic plate, and in particular, aluminum or iron plates. When aluminum plates (which are preferable to any other metallic plate) are used in the practice of this invention, the support plate is first abraded to improve its adhesive characteristics and then chemically treated to impart the desired antihalation properties.

The preferred chemical treatment composition for use in the practice of this invention is an aqueous solution of a chromic compound, which includes, for example, chromic acid, water-soluble salts thereof, and ferricyanic or ferrocyanic acid and water-soluble salts thereof. Specific examples of such treatment compositions are disclosed in U.S. Pat. Nos. 2,796,370 and 2,796,371, both issued on June 18, 1957, the disclosures of which are hereby incorporated herein by reference.

Generally, the treating compositions useful in the practice of this invention contain either chromic acid or sodium bichromate, as a required component, and mixtures of potassium ferricyanide, barium fluosilicate, sodium ferrocyanide, sodium fluoborate, potassium fluozirconate and related compositions. The presently preferred treating composition is a 2 percent aqueous solution of "Alodine 1200" manufactured by Amchem Products, Inc., Ambler, Pennsylvania. The treating composition is typically first placed in a bath and then the aluminum support plate is immersed in the bath for approximately 40 seconds. After the support plate has been treated in this fashion, it generally changes its color from the metallic aluminum color to an orange color. In this way, the orange-colored aluminum support plate itself provides the antihalation function for the resultant photopolymer printing plate.

It has been recognized in the practice of this invention that chromic acid or bichromate-containing treating compositions impart the most desirable antihalation characteristics to the resultant photopolymer plate, because chrome absorbs light having a wavelength of approximately 357.9 m$\mu$. This observation is significant because the photopolymer composition used in the practice of this invention is activated upon exposure to light having a wavelength between about 300 and 400 m$\mu$. It has been recognized in the practice of this invention that the use of the chromic acid or bichromate-containing treating agent and its resultant coating having the ability to absorb light within the wavelength range required to activate the photopolymer vastly decreases the amount of deflected light within the photopolymer during exposure. This unique light absorption characteristic, in turn, imparts an excellent antihalation characteristic to the plate and, in fact, can reduce the amount of deflected light during processing from 30 to 10 percent or less, and can result in a plate that has sharper relief shoulder angles and is capable of producing excellent half-tone images.

In order to improve the degree of adhesion between the treated metallic support plate and the photopolymer layer, a thin layer of a primer composition is applied to the treated plate after it has been chemically treated to impart the desired antihalation properties. Generally, a primer layer of about 0.1 to 0.4 mil in thickness is applied to the treated plate by such conventional means as spraying, dipping or rolling, e.g., spraying the plate with primer, dipping the plate in the primer composition or rolling the primer composition onto the plate.

It has been found that the preferred primer compositions, useful for improving the adhesive properties for the photopolymerizable compositions used in the practice of this invention, include: (1) a 10 percent by weight aqueous solution of polyvinyl alcohol, (2) a mixture of $\beta$-hydroxyethyl methacrylate, polyvinyl alcohol and water, or (3) a mixture of polyvinyl alcohol and an emulsion of ethylene-acrylic acid copolymer resin. Through use of such thin layers of primer compositions between the treated support plate and photopolymerizable layer, improved adhesive bonds are formed between the plate and photopolymer.

After the primer composition has been baked and cured a desired thickness of photopolymerizable composition, generally 3 to 30 mils in thickness, is cast on the plate. A relief printing plate can be prepared from this finished plate by putting a photopolymerizable layer in contact with a half-tone negative or line negative and exposing it to active light. A light having an abundance of ultraviolet rays is preferred as the light source because the photopolymerization initiator begins to polymerize by means of the irradiation of ultraviolet rays. Examples of the light source include a carbon arc lamp and a mercury vapor lamp, and among these, an ultra high pressure mercury lamp ("Jet Light", made by ORC Mfg. Co., Japan) is preferred. After irradiation with the ultraviolet light, the non-exposed area of the photopolymerizable layer is washed out with water to give a relief image printing plate. The depth of the relief is ordinarily 3 to 30 mils, depending upon its intended use. Such depth may be attained by adjusting the thickness of the photopolymerizable layer.

Preferably, before the plate is put in contact with a halftone or line negative, exposed to light and prepared as a relief printing plate, it has been found desirable to preexpose the plate to ultraviolet light for a period of approximately 7 to 8 seconds. It has been recognized that such preexposure conditions the plate for processing, reduces the level of undesired oxygen contained in the photopolymerizable layer and eliminates the need to precondition the plate by such conventional techniques as exposing it to carbon dioxide for extended periods of time.

The relief printing plates prepared by the practice of this invention can be used both for direct printing or as original plates for paper mache. It has been observed, however, that after prolonged exposure to moisture in the air the photopolymer used in the plate sometimes tends to soften. Moreover, it has also been observed that after prolonged use in printing conditions, the recessed areas of the plate sometimes tend to pick-up dried ink, paper or other foreign materials and thus produce a highly undesirable linting condition. Both of these significant problems have been obviated, however, by applying to the finished relief printing plate a solution of silicon oil, e.g., dimethylpolysiloxane. Generally, about 10 to 40 percent by weight of the silicon oil is dissolved in an aromatic solvent for the oil, such as xylene or toluene, and then uniformly applied over the surface of the relief printing plate. Although a coating of the silicon oil solution having a thickness of about 1 to 20 microns is useful in obviating the polymer softening and linting problems, it is especially preferred that the silicon oil coating thickness be in the range of about 8 to 12 microns, since too little silicon oil is ineffective and too much tends to impair the final relief image obtained from the relief printing plate.

Similarly, it has been found that although about 10 to 40 percent by weight solutions of silicon oil can be effectively used in the practice of this invention, it is preferred that the silicon oil concentration in the applied solution be about 30 percent by weight, since excessively high concentrations of the silicon oil make it difficult to spray onto the relief printing plate.

The silicon oils found useful in the practice of this invention include methylphenylsilicon oil having methylphenyl groups and dimethylpolysiloxane represented by the structural formula:

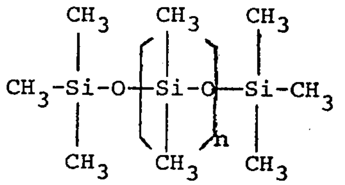

wherein $n$ is an integer larger than 1. It has been found that application of such silicon oil solutions, in the desired concentrations at the desired thicknesses, reduces the limiting and reduces the tendency of the polymer composition of the plate to soften upon exposure to water vapor in the air.

Several embodiments of the present invention are illustrated in the following examples. All parts and percentages are by weight unless otherwise indicated.

EXAMPLE 1

An aluminum plate is subjected to the chromate treatment by immersing it in a bath of a treating solution of "Alodine 1200" (manufactured by Amchem Products, Inc.) and dried with hot air of 180°C. for 2 minutes. On the thus treated plate, a water soluble paint consisting of partially saponified polyvinyl acetate (average degree of polymerization, 500; degree of saponification, 80.5 mol%) and water (90 parts) is applied by the aid of a roll coater or a bar coater to make a coating of 3 to 20$\mu$ in thickness and dried with hot air to 100 to 200°C. for 1 to 5 minutes to give a support material for a photopolymer plate.

EXAMPLE 2

An aluminum plate is sanded with a mixed silica of 600 mesh to give a support material for a photopolymer plate.

EXAMPLE 3

Partially saponified polyvinyl acetate (average degree of polymerization, 500; degree of saponification, 80.5 mol%) (70 parts), partially saponified polyvinyl acetate (average degree of polymerization, 500; degree of saponification, 88.5 mol%) (30 parts) and pure water (80 parts) are mixed and dissolved in a kneader at 90° to 95°C. for 30 minutes. After the temperature is lowered to 60°C., $\beta$-hydroxyethyl methacrylate (100 parts) containing p-methoxyphenol (0.2 part), benzoin isopropyl ether (2.5 parts) and trimethylolpropane trimethacrylate (8 parts) is dropwise added thereto in 40 minutes. The mixture is admixed with pure water (1 part) containing red iron oxide pigment (0.0025 part) and defoamed under reduced pressure to give a photosensitive resin composition.

The thus obtained photosensitive resin composition is spread on the support material prepared in Example 1 or 2, and a polyvinyl chloride sheet is placed thereon. The resulting piled material is passed through between two rolls set up at fixed interval so as to make 0.65mm in thickness of the resin composition. After cooling, the polyvinyl chloride sheet is peeled off, and the resultant material is dried at 60°C. for 30 minutes to give a photopolymer plate.

EXAMPLE 4

The photopolymer plate prepared in Example 3 is exposed to the light of a high pressure mercury lamp for 7 seconds form a distance of 70cm. Then, the plate is put in contact with a negative in a vacuum printing frame and exposed to light the aid of a high pressure mercury lamp for 1 minute from the distance of 70cm. The plate is developed by spraying water thereon and dried to 100°C. for 3 minutes to give a relief printing plate.

EXAMPLE 5

On the surface of the relief printing plate prepared in Example 4, a solution of silicon oil having the molecular structure of straight dimethylpolysiloxane represented by the formula:

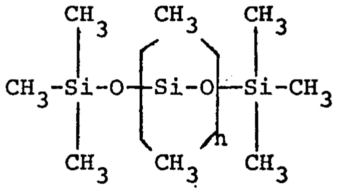

wherein $n$ is an integer larger than 1 or methylphenylsilicon oil having methyphenyl groups (30 parts) in xylene or toluene (70 parts) is applied by air spraying or as aerosol to make a coating of 1 to 10$\mu$ in thickness. The thus coated plate is attached to a high speed rotary press for printing of newspapers to execute printing.

By coating the relief printing plate with silicon oil, especially the lowered parts of the reticulation of photographs are wetted therewith, which results in prevention of the sticking of paper, dusts formed during printing and the staying of ink due to printing pressure. Thus, the staining at the highlight parts and the blocking at the shadow parts are usually seen in the conventional relief printing resin plate can be prevented to assure superiorly printed papers.

EXAMPLE 6

The relief printing plate prepared in Example 4 is further dried for 7 minutes to a sufficient hardness for an original plate for taking a paper pattern (not less than 30 in Barcol hardness) and coated with silicon oil in the same manner as in Example 5 to give an original plate for taking a paper pattern.

The thus obtained original plate shows an excellent paper pattern-taking property as a zinc plate or a magnesium plate does, softening of relief parts with water present in the paper pattern being prevented during the paper pattern-taking owing to the coating of silicon oil.

EXAMPLE 7

An aluminum plate is subjected to the chromate treatment according to the following steps: immersing in a 3 percent aqueous solution of "Ridoume 53" (manufactured by Amchem Products, Inc.) at 50°C. for 15 minutes, washing with water, immersisng in a 2 percent aqueous solution of "Alodine 1200" (manufactured by Amchem Products, Inc.) at 20°C. for 40 seconds, washing with water and drying with hot air of 180°C. for 2 minutes.

By the final drying, the dissolution of the chromate present in the film formed by the treatment into a photopolymer layer as chromium ions can be prevented, which assures the stability of the resultant photopolymer plate in the preparation of the relief printing plate, affording a superior relief image.

On the thus treated aluminum plate, a water soluble paint consisting of partially saponified polyvinyl acetate (average degree of polymerization, 500; degree of saponification, 80.5 mol%) (10 parts) and water (90 parts) is applied by the aid of a roll coater or a bar coater to make a coating of 3 to 30$\mu$ in thickness and dried with hot air of 100° to 200°C. for 1 to 5 minutes to give a support material for a photopolymer plate. By coating the treated plate with the water soluble paint, an excellent adhesion can be attained between the treated plate and photopolymer layer to give a photopolymer plate utilizable for practical use.

By the use of the thus prepared material, the reflection rate of the active light required for polymerization in the range of wavelength of 2000 to 4000 A is greatly decreased due to absorption at the wavelength of 3579 A by the metallic chromium, so that the use of antihalation layer or the addition of dye is not required to obtain an excellent relief image.

EXAMPLE 8

On an aluminum plate subjected to the chromate treatment as in Example 7, a water soluble paint consisting of partially saponified polyvinyl acetate (average degree of polymerization, 500; degree of saponification, 80.5 mol%) (15 parts), -hydroxyethyl methacrylate (20 parts), azobisisobutyronitrile (0.2 part) and pure water (65 parts) is applied by the aid of a roll coater or a bar coater to make a coating or 3 to 20$\mu$ in the thickness and dried with hot air of 100° to 200°C. for 1 to 5 minutes ot give a support material for a photopolymer plate.

EXAMPLE 9

On an aluminum plate subjected to the chromate treatment as in Example 7, a water soluble paint consisting of partially saponified polyvinyl acetate (average degree of polymerization, 500; degree of saponification, 80.5 mol%) (30 parts), an emulsion of an ethylene-acrylic acid copolymer resin (10 parts) and water (60 parts) is applied by the aid of a roll coater, or a bar coater to make a coating of 3 to 20$\mu$ in thickness and dried with hot air of 100° to 200°C. for 1 to 5 minutes to give a support material for a photopolymer plate.

Although a number of specific embodiments have been disclosed herein, it should be understood that the present invention is in no way limited to the disclosed embodiments. Rather, it is intended that various modifications and equivalents of the disclosed embodiments fall within the spirit and scope of the invention as defined by the following claims.

I claim:

1. In a photopolymer printing plate developable with water and including a metallic support material and a layer of a water-soluble photosensitive resin composition disposed thereon, said resin composition including:

a. about 0.001 to 0.15 parts by weight of a polymerization initiator activatable by actinic light;

b. about 0.1 to 3.0 parts by weight of at least one unsaturated ethylenic monomer capable of forming a polymer by photo-initiated polymerization in the presence of a polymerization initiator activatable by actinic; and c. about 0.1 to 1.0 parts by weight of a partially saponified, water-soluble, polyvinyl acetate polymer compatible with said monomers, containing both acetyl and hydroxy groups, and having a polymerization degree of about 300 to 2000 and a saponification degree of about 65 to 99 mole percent, the improvement comprising:

the surface of said metallic support material being treated with a treating composition containing water, a chromic compound selected from the group consisting of chromic acid or sodium bichromate, and at least one additional component selected from the group consisting of potassium ferricyanide, potassium fluosilicate, sodium ferrocyanide, sodium fluoborate, and potassium fluozirconate; and said treated metallic support material having applied thereto prior to the deposition of said resin composition thereon a thin layer of an adhesion-promoting primer composition selected from the group consisting of an aqueous solution of partially saponified polyvinyl acetate, a mixture of $\beta$-hydroxyethyl methacrylate, water and partially saponified polyvinyl acetate, and a mixture of partially saponified polyvinyl acetate and an emulsion of ethylene-acrylic acid copolymer resin, and layer of adhesion-promoting primer layer having a thickness in the range of about 0.1 to 0.4 mil.

2. The photopolymer printing plate of claim 1 wherein said metallic support material is aluminum and wherein the surface of said metallic support material after treatment with said treating composition absorbs light having a wavelength between about 300 and 400 m$\mu$.

3. The photopolymer printing plate of claim 1 wherein said partially saponified polyvinyl acetate polymer comprises one or more partially saponified polyvinyl acetate polymers having different saponification degrees, wherein the arithmetic average of the different saponification degrees, based upon the weight percent of each polymer, is within the range of about 65—99 mole percent.

4. The photopolymer printing plate of claim 1 wherein said unsaturated ethylenic monomers comprise at least one monofunctional monomer and at least one polyfunctional monomer, and are selected from the group consisting of (a) an acrylic or methacrylic ester or a lower alkanol having at least one hydroxy group and (b) an acrylic or methacrylic ester of a polyethylene glycol having an ether or ester group at the end opposite from said ester moiety, the number of ethylene oxide units in said polyethylene glycol ester being 1 to 9 to 23 , and wherein said photopolymerization initiator is selected from the group consisting of benzoin methyl ether, benzoin ethyl ether, benzoin isopropyl ether, benzoin octyl ether, benzoin vinyl ether and benzoin allyl ether.

5. The photopolymer printing plate of claim wherein said treating composition contains about 2 percent by weight of said chromic compound.

6. The photopolymer printing plate of claim 1 wherein said metallic support material is aluminum and said support material is treated with said treating composition for a period of time such that the surface of said support material will absorb light having a wavelength in the range of that required to initiate the polymerization of said photosensitive resin composition.

7. In a relief photopolymer printing plate developable with water and including a support material, a thin layer of adhesive composition, and a layer of a water soluble photosensitive resin composition disposed thereon, said composition comprising about 0.1 to 3.0 parts by weight of at least one unsaturated ethylenic monomer having a boiling point above 100°C, a molecular weight below 1500 and 1 to 4 polymerizable ethylenic groups, said ethylenic monomer being polymerizable by means of actinic light in the presence of photopolymerization initiator, about 0.001 to 0.15 parts by weight of a partially saponified polyvinyl acetate, the improvement comprising:

coating the surface of the developed relief plate with a silicon oil solution selected from the group consisting of methylphenylsilicon oil having methylphenyl groups or dimethylpolysiloxane represented by the structural formula:

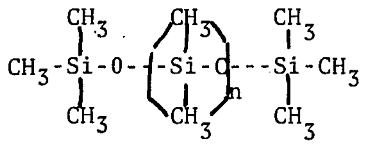

wherein *n* is an integer larger than 1, said coating of silicon oil solution having a thickness in the range of about 1 to 20 microns.

8. The coated relief photopolymer printing plate of claim 4 wherein said silicon oil is dissolved in an aromatic solvent for said oil.

9. The coated relief photopolymer printing plate of claim 8 wherein the solution of silicon oil in aromatic solvent contains silicon oil in a concentration range of about 10 to 40 percent by weight.

10. The coated relief photopolymer printing plate of claim 4 wherein the thickness of said coating of silicon oil solution on the surface of the relief photopolymer printing plate is in the range of about 8 to 12 microns.

11. The coated relief photopolymer printing plate of claim wherein said photopolymerization initiator is a benzoin alkylate compound, said support material is a metallic plate, and said partially saponified polyvinyl acetate comprises one or more partially saponified polyvinyl acetate polymers having different degrees of saponification and different degrees of polymerization, wherein the average degree of polymerization is 300 to 2000 and average saponification degree is 65 to 99 mole percent.

12. The coated relief photopolymer printing plate of claim 4 wherein said support material is a metallic plate which has been treated with a composition containing water, a chromic compound selected from the group consisting of chromic acid or sodium bichromate, and at least one additional component selected from the group consisting of potassium ferricyanide, potassium fluosilicate, sodium ferrocyanide, sodium fluoborate, and potassium fluozirconate, and wherein said adhesion layer is an adhesion-promoting composition having a thickness between about 0.1 and 0.4 mil and selected from the group consisting of an aqueous solution of partially saponified polyvinyl acetate, a mixture of β-hydroxyethyl methacrylate, water and partially saponified polyvinyl acetate, and a mixture of partially saponified polyvinyl acetate and an emulsion of ethylene-acrylic acid copolymer resin.

* * * * *

UNITED STATES PATENT OFFICE
CERTIFICATE OF CORRECTION

Patent No. 3,877,939 Dated April 15, 1975

Inventor(s) Sakuo Okai

It is certified that error appears in the above-identified patent and that said Letters Patent are hereby corrected as shown below:

In the Abstract delete "leric" and insert therefore --lenic--.

In Column 2, line 17 delete "moisute" and insert therefore --moisture--.

In Column 3, line 14 delete "ether" and insert therefore --either--.

In Column 7, line 11 delete "limiting" and insert therefore --linting--.

In Column 7, line 26,before "and" insert --(10 parts)--.

In Column 7, line 66, delete "form" and insert --from--.

In Column 8, line 1, after "light" insert --by--.

In Column 8, line 4, delete "to" (first instance) and insert therefore --at--.

In Column 8, line 33 delete "are" and insert therefore --as--.

In Column 9, line 24, before "-hydroxyethyl" insert --$\beta$--.

In Column 9, line 28, delete "the".

In Column 9, line 29, delete "ot" and insert therefore --to--.

UNITED STATES PATENT OFFICE
CERTIFICATE OF CORRECTION

Patent No. 3,877,939 Dated April 15, 1975

Inventor(s) Sakuo Okai Page 2

It is certified that error appears in the above-identified patent and that said Letters Patent are hereby corrected as shown below:

In Column 9, line 63, after "actinic" insert --light--.

In Column 10, line 19, delete "and" and insert therefore --said--.

In Column 10, line 41, delete "or" and insert therefore--of--.

In Column 10, line 46, delete "to" and insert therefore --or--.

In Column 10, line 51, after "Claim" insert --1--.

In Column 11, in lines 24 and 31; and in Column 12, at line 14, delete "4" and insert therefore --7--.

In Column 12, line 4, after the word "Claim" insert --7--.

Signed and Sealed this

*nineteenth* Day of *August 1975*

[SEAL]

*Attest:*

RUTH C. MASON
*Attesting Officer*

C. MARSHALL DANN
*Commissioner of Patents and Trademarks*